United States Patent
Cherala et al.

(10) Patent No.: US 7,535,549 B2
(45) Date of Patent: May 19, 2009

(54) SYSTEM AND METHOD FOR IMPROVEMENT OF ALIGNMENT AND OVERLAY FOR MICROLITHOGRAPHY

(75) Inventors: Anshuman Cherala, Austin, TX (US); Sidlgata V. Sreenivasan, Austin, TX (US); Kranthimitra Adusumilli, Austin, TX (US)

(73) Assignee: Board of Regents, University of Texas System, Austin, TX (US)

( * ) Notice: Subject to any disclaimer, the term of this patent is extended or adjusted under 35 U.S.C. 154(b) by 616 days.

(21) Appl. No.: 11/143,076

(22) Filed: Jun. 2, 2005

(65) Prior Publication Data
US 2005/0271955 A1    Dec. 8, 2005

Related U.S. Application Data

(60) Provisional application No. 60/576,570, filed on Jun. 3, 2004.

(51) Int. Cl.
    G03B 27/68  (2006.01)
    G03B 27/42  (2006.01)
    G03B 27/62  (2006.01)
    G03F 9/00   (2006.01)

(52) U.S. Cl. .................... 355/52; 355/53; 355/75; 430/22

(58) Field of Classification Search ............ 355/52, 355/53, 75, 77; 430/5, 22, 30; 356/400, 356/401
See application file for complete search history.

(56) References Cited

U.S. PATENT DOCUMENTS

| | | |
|---|---|---|
| 3,783,520 A | 1/1974 | King |
| 4,202,681 A | 5/1980 | McMaster et al. |
| 4,326,805 A | 4/1982 | Feldman et al. |
| 4,356,018 A | 10/1982 | McMaster |
| 4,487,623 A | 12/1984 | Claassen et al. |
| 4,600,309 A | 7/1986 | Fay |
| 4,848,911 A | 7/1989 | Uchida et al. |
| 4,865,639 A | 9/1989 | Kudo |
| 4,877,437 A | 10/1989 | Nitschke |
| 4,929,083 A | 5/1990 | Brunner |
| 5,072,126 A | 12/1991 | Progler |
| 5,074,667 A | 12/1991 | Miyatake |
| 5,148,036 A | 9/1992 | Matsugu et al. |
| 5,148,037 A | 9/1992 | Suda et al. |
| 5,171,490 A | 12/1992 | Fudim |

(Continued)

FOREIGN PATENT DOCUMENTS
EP    0298425    10/1992

(Continued)

OTHER PUBLICATIONS

Arai et al., Development of a New Parallel Manipulator with Fixed Linear Actuator, In Proceedings of Japan/USA Symposium on Flexible Automation, vol. 1, ASME, New York, pp. 145-149 Jan. 1, 1996.

(Continued)

*Primary Examiner*—Alan A Mathews
(74) *Attorney, Agent, or Firm*—Fish & Richardson P.C.

(57) ABSTRACT

The present invention provides a method for determining the forces to be applied to a substrate in order to deform the same and correct for overlay misalignment.

27 Claims, 2 Drawing Sheets

U.S. PATENT DOCUMENTS

| | | | |
|---|---|---|---|
| 5,184,176 A * | 2/1993 | Unno et al. | 355/52 |
| 5,204,739 A | 4/1993 | Domenicali | |
| 5,218,193 A | 6/1993 | Miyatake | |
| 5,331,371 A | 7/1994 | Mori et al. | |
| 5,355,219 A | 10/1994 | Araki et al. | |
| 5,414,514 A | 5/1995 | Smith et al. | |
| 5,452,090 A | 9/1995 | Progler et al. | |
| 5,477,058 A | 12/1995 | Sato | |
| 5,504,793 A | 4/1996 | Chen | |
| 5,508,527 A | 4/1996 | Kuroda et al. | |
| 5,633,505 A | 5/1997 | Chung et al. | |
| 5,726,548 A | 3/1998 | Chiba et al. | |
| 5,737,064 A | 4/1998 | Inoue et al. | |
| 5,740,699 A | 4/1998 | Ballantyne et al. | |
| 5,785,918 A | 7/1998 | Hull | |
| 5,808,742 A | 9/1998 | Everett et al. | |
| 5,854,819 A * | 12/1998 | Hara et al. | 378/34 |
| 5,876,550 A | 3/1999 | Feygin et al. | |
| 5,877,036 A | 3/1999 | Kawai | |
| 5,877,861 A | 3/1999 | Ausschnitt et al. | |
| 5,999,245 A | 12/1999 | Suzuki | |
| 6,032,549 A | 3/2000 | Tokio et al. | |
| 6,049,373 A | 4/2000 | Miyatake | |
| 6,088,103 A | 7/2000 | Everett et al. | |
| 6,150,231 A | 11/2000 | Muller et al. | |
| 6,153,886 A | 11/2000 | Hagiwara et al. | |
| 6,285,439 B1 | 9/2001 | Miyatake | |
| 6,295,120 B1 | 9/2001 | Miyatake | |
| 6,383,888 B1 | 5/2002 | Stirton | |
| 6,388,755 B1 | 5/2002 | Zhao | |
| 6,420,892 B1 | 7/2002 | Krivy et al. | |
| 6,489,068 B1 | 12/2002 | Kye | |
| 6,522,411 B1 | 2/2003 | Moon et al. | |
| 6,575,676 B2 | 6/2003 | Wang et al. | |
| 6,580,505 B1 | 6/2003 | Bareket | |
| 6,630,410 B2 | 10/2003 | Trapp et al. | |
| 6,636,311 B1 | 10/2003 | Ina et al. | |
| 6,665,119 B1 | 12/2003 | Kurtz et al. | |
| 6,696,220 B2 | 2/2004 | Bailey et al. | |
| 6,791,669 B2 | 9/2004 | Poon | |
| 6,808,344 B2 | 10/2004 | Chen | |
| 6,819,426 B2 | 11/2004 | Sezginer et al. | |
| 6,847,433 B2 * | 1/2005 | White et al. | 355/72 |
| 6,873,087 B1 | 3/2005 | Choi et al. | |
| 6,902,853 B2 | 6/2005 | Sreenivasan et al. | |
| 6,922,906 B2 | 8/2005 | Choi et al. | |
| 6,954,275 B2 | 10/2005 | Choi et al. | |
| 6,986,975 B2 | 1/2006 | Sreenivasan et al. | |
| 7,027,156 B2 | 4/2006 | Watts et al. | |
| 7,070,405 B2 | 7/2006 | Sreenivasan et al. | |
| 7,098,572 B2 | 8/2006 | Choi et al. | |
| 7,186,483 B2 | 3/2007 | Sreenivasan et al. | |
| 2001/0023042 A1 | 9/2001 | Dirksen et al. | |
| 2002/0069525 A1 | 6/2002 | Hada et al. | |
| 2003/0081193 A1 | 5/2003 | White et al. | |
| 2003/0112421 A1 | 6/2003 | Smith | |
| 2004/0033515 A1 | 2/2004 | Cao et al. | |
| 2005/0051742 A1 | 3/2005 | Shiraishi | |
| 2005/0274219 A1 | 12/2005 | Choi et al. | |
| 2005/0275251 A1 | 12/2005 | Choi et al. | |
| 2005/0275311 A1 | 12/2005 | Choi et al. | |
| 2006/0005657 A1 | 1/2006 | Choi et al. | |
| 2006/0019183 A1 | 1/2006 | Voisin | |
| 2006/0114450 A1 | 6/2006 | Nimmakayala et al. | |
| 2006/0115999 A1 | 6/2006 | Sreenivasan et al. | |
| 2006/0126058 A1 | 6/2006 | Nimmakayala et al. | |
| 2006/0158651 A1 | 7/2006 | Watts et al. | |

FOREIGN PATENT DOCUMENTS

| | | |
|---|---|---|
| EP | 0411032 | 5/1994 |
| EP | 0581620 | 2/1998 |
| EP | 0839769 | 1/2002 |
| EP | 0872456 | 1/2002 |
| JP | 55-88332 | 7/1980 |
| JP | 63-165118 | 7/1988 |
| JP | 1-234213 | 9/1989 |
| JP | 11-060255 | 3/1999 |
| WO | WO 02/064519 | 8/2002 |

OTHER PUBLICATIONS

Williams et al., Six Degree of Freedom Mag-Lev Stage Development, SPIE vol. 3051, 856-867 Jan. 1, 1997.

Wang et al., Passive Compliance versus Active Compliance in Robot-Based Automated Assembly Systems, Industrial Robot vol. 25, No. 1, pp. 48-57 Jan. 1, 1998.

Rong et al., Design and Analysis of Flexure-Hinge Mechanism Used in Micro-Positioning Stages, ASME vol. 2, pp. 979-985 Jan. 1, 1994.

Mansky et al., Large-Area Domain Alignment in Block Copolymer Thin Films Using Electric Fields, Macromolecules. vol. 31. No. 13, pp. 4399-4401 Jun. 9, 1998.

White et al., Novel Alignment System for Imprint Lithography, J. Vac. Sci. Technol. B 18(6), pp. 3552-3556 Nov. 1, 2000.

Uchida et al., A Mask-to-Wafer Alignment and Gap Setting Method for X-ray Lithography Using Gratings, J. Vac. Sci. Technol. B 9 (6), pp. 3202-3206 Nov. 1, 1991.

Abstract of Japanese Patent 55-88332, Apr. 14, 2004.

Armitage et al., Analysis of Overlay Distortion Patterns, SPIE vol. 921 Integrated Circuit Metrology, Inspection, and Process Control II (1988) Jan. 1, 1988.

Moon et al., Interferometric-Spatial-Phase Imaging for Six-Axis Mask Control, MIT NanoStructures Laboratory, Research Laboraty of Electronics Oct. 17, 2003.

Chen et al., Adaptive Alignment of Photomasks for Overlay Placement, Journal of Vacuum Science. B 20(6), pp. 3099-3105 Nov. 1, 2002.

Wronosky et al., Wafer and Reticle Positioning System for the Extreme Ultraviolet Lithography Engineering Test Stand, Emerging Lithography Technologies, Proceedings of SPIE vol. 3997, pp. 829-839 Jul. 1, 2000.

Park et al., Aligning Liquid Crystals Using Replicated Nanopatterns, PSI Scientific Report 2002, vol. VII, p. 85 Mar. 1, 2003.

Deng et al., Simulation of Exposure and Alignment for Nano-imprint Lithography, Proc. SPIE, vol. 4688-93, p. 842-849 Jan. 1, 2002.

Deng et al., Rigorous Electromagnetic Simulation Applied to Alignment Systems, Proc. SPIE, vol. 4346-164, p. 1533-1540 Jan. 1, 2001.

Choi et al., Distortion and Overlay Performance of UV Step and Repeat Imprint Lithography, MNE Micro- and Nano-Engineering Conference Sep. 1, 2004.

Nordquist et al., Image Placement Issues for ITO-based Step and Flash Imprint Lithography Templates, J. Vac. Sci. Technol. B, pp. 695-701 Mar. 1, 2004.

Gehoski et al., Evaluation of the Imprio 100 Step and Flash Imprint Lithography Tool, Proceedings of SPIE, vol. 5374, pp. 1006-1016 May 1, 2004.

Choi et al., Layer-to-Layer Alignment for Step and Flash Imprint Lithography, SPIE's 26th Intl. Symp. Microlithography: Emerging Lithographic Technologies, Santa Clara, CA Mar. 1, 2001.

Sreenivasan et al., U.S. Appl. No. 11/373,533, entitled Alignment Systems for Imprint Lithography, filed Mar. 10, 2006.

Cherala et al., U.S. Appl. No. 11/687,902, entitled System to Vary Dimensions of a Thin Template, filed Mar. 19, 2007.

Cherala et al., U.S. Appl. No. 11/695,469, entitled Deformation Using Nullspace and Methods Optimization Techniques, filed Apr. 2, 2007.

Sreenivasan et al., U.S. Appl. No. 11/695,850, entitled Method of concurrently patterning a substrate having a plurality of fields and a plurality of alignment marks, filed Apr. 3, 2007.

Nimmakayala et al. U.S. Appl. No. 11/694,644, entitled Enhanced Multi Channel Alignment, filed Mar. 30, 2007.

Shackleton et al., U.S. Appl. No. 11/694,193, entitled Preserving Filled Features when Vacuum Wiping, filed Mar. 30, 2007.

Farhadinia, Finite Element Analysis and Experimental Evaluation of Buckling Phenomena in Laminated Composite Tubes and Plates, Diss. Abstr. Int. Jan. 1, 1992.

Anisovich et al., Penetration of Gases into Metal in Gating Systems, Kokl. Akad. Nauk Bearusi Mar. 1, 1984.

Abstract of Japanese Patent 11-060255, dated Mar. 2, 1999.
Abstract of Japanese Patent 1-234213, dated Sep. 19, 1989.
Abstract of Japanese Patent 63-165118, dated Jul. 8, 1988.
PCT/US05/19392 International Search Report, Aug. 25, 2008.

* cited by examiner

SYSTEM AND METHOD FOR IMPROVEMENT OF ALIGNMENT AND OVERLAY FOR MICROLITHOGRAPHY

CROSS-REFERENCE TO RELATED PATENT APPLICATIONS

The present patent application claims priority to U.S. provisional patent application No. 60/576,570 entitled SYSTEM AND METHOD FOR IMPROVEMENT OF ALIGNMENT AND OVERLAY FOR MICROLITHOGRAPHY, filed Jun. 3, 2004 and having Sidlgata V. Sreenivasan, Anshuman Cherala and Kranthi M. Adusumilli listed as inventors.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of N66001-01-1-8964 awarded by the Defense Advanced Research Projects Agency (DARPA).

BACKGROUND OF THE INVENTION

The present invention relates generally to microlithography. More particularly, the present invention is directed towards improving alignment and overlay during the patterning of substrates.

Microlithography is used in the formation of integrated circuits which may require transfer of multiple layers of patterns onto a substrate, superimposed upon on another. As a result, transfer of patterns onto substrates is an important process in the fabrication of integrated circuits. Pattern transfer techniques are also used in optical technology, biotechnology, and the like. A common technique for patterning of substrates is an optical lithography process known as photolithography. An original pattern, referred to as a master pattern, is stored on photomasks. Photomasks are typically fused silica plates with a pattern recorded therein employing a high-precision laser or an electron beam. Photomask patterns are transferred onto a photo-sensitive resist material coated on top of the substrate undergoing processing. The substrate is then etched and the transferred patterns are used to control the etch process so that a desired pattern may be created in the substrate. A differing patterning process, in which the topography of a mold defines the pattern transferred onto a substrate, is known as imprint lithography.

In either of the aforementioned patterning processes the dimension of the smallest feature in the pattern, called the critical dimension (CD) may be maintained to within 10 nm. As a result, a successful transfer of a pattern onto the substrate requires precise positioning with respect to the features of an existing pattern on the substrate. A general rule of thumb states that for a pattern layer to be functional, every point on the pattern must be aligned to every point on the underlying pattern to within $1/3^{rd}$ of the CD in the pattern. Overlay requirements for various technology nodes are available from International Technology Roadmap for Semiconductors, at http://public.itrs.net. The process by which to properly position the transferred patterns is referred to as alignment. By achieving proper alignment, desired pattern overlay is achieved. Specifically, alignment accuracy is measured at the position of a few alignment marks. This accuracy is a measure of the precision in the patterning tool's alignment system.

Overlay accuracy, which is a measure of the alignment of each point in the pattern, is measured everywhere in a field to be patterned in addition to the location of the alignment marks. As a result, overlay information may include error information in addition to the error information associated with alignment information. For example, overlay error may result from lens distortions, chuck-induced wafer distortion, and image placement errors on the mask/mold, referred to collectively as pattern device, which may cause significant overlay errors, despite accurate alignment. These errors may result in distortions in transferred patterns that may substantially reduce production yield. Pattern to pattern overlay errors are typically quantified by measuring the alignment over a grid of points in a field. Prior art attempts have been made to attenuate alignment errors at the site of the alignment marks.

In U.S. Pat. No. 6,847,433 to White et al. disclose a deformable holder, system, and process where long range errors (any of lithography, metrology, or overlay errors) between the image of a mask and an existing pattern on a wafer from a number of potential sources are corrected. The long range errors are determined using either a through-the-lens alignment metrology system or an around-the-lens metrology system. Deformation values are determined to compensate for the long range errors. The deformation values are determined by either solving simultaneous equations or by finite-element linear-stress-analysis (FEA). The mask or wafer is then distorted, in-plane, by an amount related to the determined deformation values using an actuator such a piezoelectric ceramic to push or pull the mask or wafer to substantially realign the projected image of the mask and the existing pattern on the wafer. This approach guarantees alignment at the site of the alignment marks and not necessarily overlay over the entire field. Another drawback with this and other prior art attempts at minimizing pattern distortions concerns the computational requirements to determine deformation values, especially if these types of corrections are to be done real-time with time constraints. Typically, determination of deformation values requires a great amount of computational power that may increase the cost of a system and is often inaccurate.

What is needed, therefore, is an improved system and technique to correct alignment and overlay errors and to compute deformation values.

SUMMARY OF THE INVENTION

The present invention is directed to a method and system that features determining deformation parameters that a patterned device would undergo to minimize dimensional variations between a recorded pattern thereon and a reference pattern. To that end, the method includes comparing spatial variation between features of said recorded pattern with respect to corresponding features of said reference pattern; and determining deformation forces to apply to said patterned device to attenuate said dimensional variations, with said forces having predetermined constraints. The system carries out the function of the method. These and other embodiments are discussed more fully below.

DETAILED DESCRIPTION OF THE INVENTION

Figure 1:
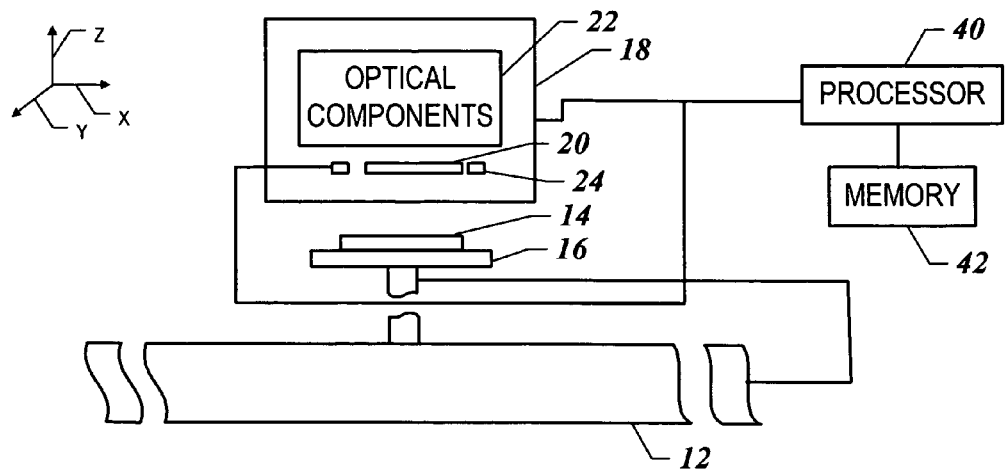
FIG. 1 is a simplified view of a lithographic system in accordance with the present invention.

FIG. 1 depicts a lithographic system 10 in accordance with one embodiment of the present invention that includes a stage 12 having a support 16. A substrate 14 is disposed upon support 16, e.g. a pedestal or a chuck. Support 16 may be moveably coupled with respect to a stage 18 through known mechanisms or may be fixedly attached thereto. Disposed opposite to support 12 is an image generation system 18. Image generation system 18 may be any known in the art, including a photolithographic such as included in a stepper, such as the MA300Plus available from Suss Microtec of Munich Germany, or an imprint lithographic patterning system, such as included in the Imprio™ 250 sold by Molecular Imprints, Inc. of Austin, Tex. Image generation system 18 includes a patterned device 20 having an original pattern formed therein that is the basis of the pattern to be formed on substrate 14, as well as, a source of actinic energy and optical subsystems required to pass the actinic energy through patterned device 20 and impinge upon substrate 14, shown generally as optical components 22. In a photolithographic system, patterned device 20 is typically a mask. In an imprint lithographic system patterned device 20 is a patterned region of a template, typically referred to as a mold.

Figure 2:
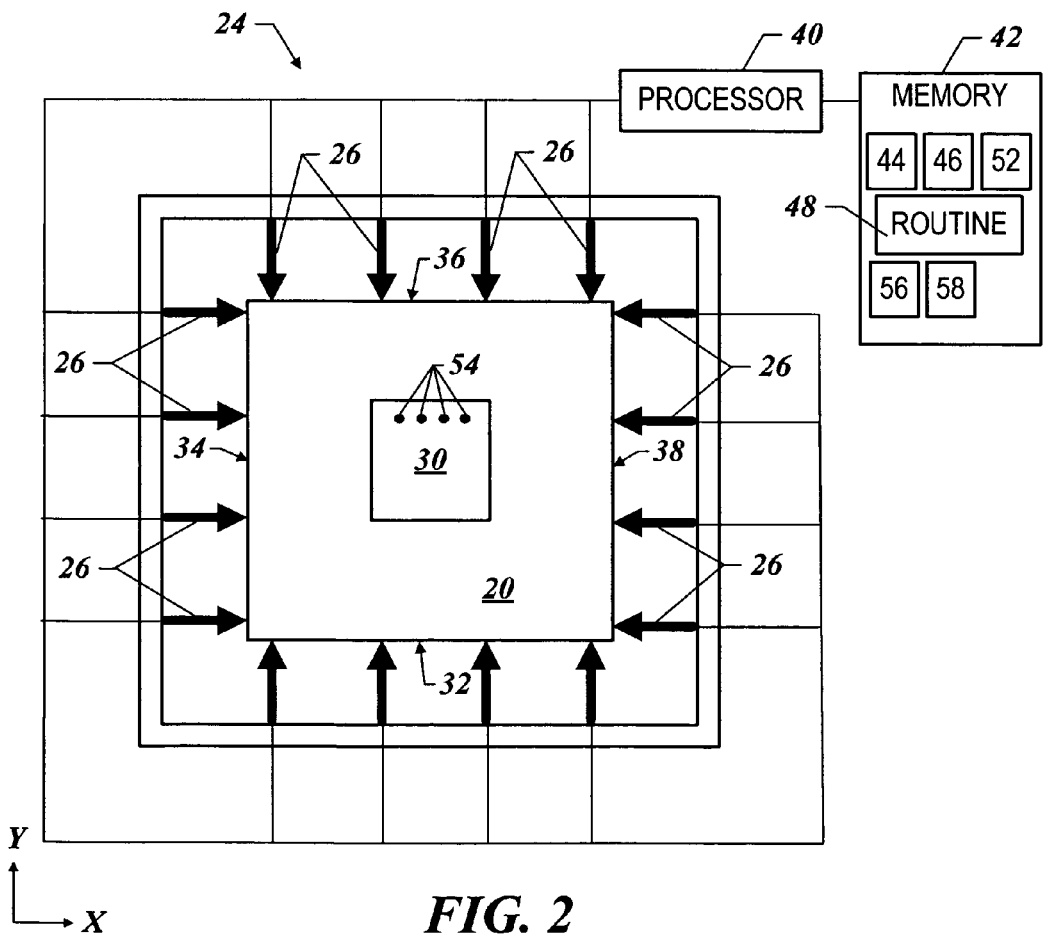
FIG. 2 is a simplified plan view of a holder for a patterned device, both shown in FIG. 1, in accordance with the present invention.

Referring to FIGS. 1 and 2, surrounding device 20 is an actuator system 24 to facilitate alignment and overlay registration. To that end, system 10 includes a plurality of actuators 26 coupled between a frame 28 and patterned device 20, which in the present embodiment is a fused-silica template having integrally formed therein a mold 30, which is typically associated with imprint lithography. Mold 30 may have features thereon, e.g., recesses and protrusions, or may be substantially featureless so as to define a substantially smooth, if not planar, surface. Each of actuators 26 are arranged to facilitate generation of a force on one of the four sides 32, 34, 36 and 38 of patterned device 20. The plurality of actuators 26 are arranged so that an equal number are present on opposing sides. Specifically, it is desired that actuators 26 are arranged in pairs disposed on opposing sides of patterned device 20, with each actuator 26 of a pair being disposed opposite to the remaining actuator 26 of the pair of actuators 26. Operation of actuators 26, as well as pattern generation system 18, pedestal 16 and stage 12, is achieved under control of a processor 40 that is in electrical communication therewith. To that end, a control program is stored in a memory 42 as computer readable code. Memory 42 is in data communication with processor 40 so that the control program may be operated on by the processor 40 to generate control signals that are transmitted to actuators 26.

Referring to FIGS. 1 and 2, system 24 facilitates alignment and overlay registration by selectively deforming patterned device 20. This facilitates correcting various parameters of the pattern shape, i.e., magnification characteristics, skew/orthogonality characteristics, and trapezoidal characteristics. Magnification characteristics may be magnification error, such as where the overall pattern changes from a square shape to a rectangular shape. Skew/orthogonality characteristics may be skew/orthogonality error where adjacent edges form an oblique or obtuse angle with respect to one another instead of an orthogonal angle. Trapezoidal characteristics may be trapezoidal error where as in where a square/rectangular assumes the shape of a trapezium, with trapezium being defined in accordance with the United States/American definition and including a trapezoid. To control the pattern shape, patterned device 20 may be selectively deformed by actuators 26 to minimize, if not cancel, the distortions present, thereby reducing overlay errors. To that end, patterned device 20 is inspected employing known image placement or image registration systems, e.g., LMS IPRO3 available from Leica Microsystems of Bannockburn, Ill. Measured information 44 concerning the location of the features on patterned device 20 would be mapped into memory 42. The features that measured information 44 represents are reference marks present on patterned device 20 to facilitate overlay and alignment techniques. The features may include any known alignment mark, such as box-in-box; cross-in-cross and/or vernier scale marks, referred to as overlay features. The overlay features are usually positioned at differing regions of patterned device 20 as room permits and are arranged in a polygonal, if not rectangular grid.

Loaded into memory 42 would be reference information 46 against which measured information 44 would be compared. Reference information 46 would include information concerning an optimal, or desired, location of overlay features and, therefore, the pattern on patterned devices 20. This information may be obtained from an existing reference patterned device (not shown) that may be employed as a standard against which patterned device 20 is measured. Alternatively, reference information 46 may be obtained from a GDS file that is employed to form the pattern on patterned device 20. Considering that errors, or distortion, in the pattern on the patterned device 20 may be attributed to the writing and etch processes used to form patterned device 20, computer data of the type employed in computer aided design software may provide reference information 46 with the most accurate reflection of the optimal pattern. Exemplary computer data is that employed by CATS™ software sold by Synopsis, Inc., of Mountain View, Calif.

Figure 3:
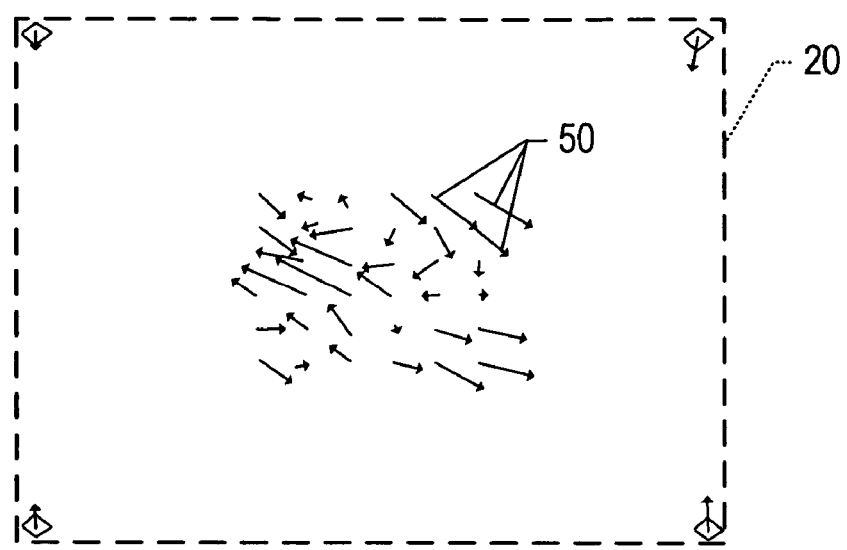
FIG. 3 is a simplified plan view showing distortion vectors determined in accordance with the present invention.

Referring to both FIGS. 2 and 3, also stored in memory 42 is a routine 48 that facilitates comparison of measured information 44 with reference information 46. Routine 48 includes X and Y positional variations between features in measured information 44 with respect to corresponding features in reference information 46 and generates image placement variation data shown in the following Table:

| Image Placement Variation Table | | |
| --- | --- | --- |
| Point | X ($\mu$m) | Y ($\mu$m) |
| 1 | 0.01 | −0.012 |
| 2 | 0 | −0.003 |
| 3 | −0.003 | −0.001 |
| 4 | 0.013 | −0.013 |
| 5 | 0.016 | −0.016 |
| 6 | 0.018 | −0.014 |
| 7 | 0.012 | −0.012 |
| 8 | −0.001 | −0.001 |
| 9 | −0.012 | −0.004 |
| 10 | −0.001 | −0.007 |
| 11 | 0.005 | −0.014 |
| 12 | 0.009 | −0.013 |
| 13 | −0.004 | −0.004 |
| 14 | −0.017 | 0.005 |
| 15 | −0.02 | 0.01 |
| 16 | −0.01 | −0.002 |
| 17 | −0.007 | −0.008 |
| 18 | 0 | −0.007 |
| 19 | −0.008 | 0.007 |
| 20 | −0.022 | 0.013 |
| 21 | −0.024 | 0.017 |
| 22 | −0.011 | 0.012 |
| 23 | −0.005 | 0 |
| 24 | 0.001 | 0 |
| 25 | 0.01 | −0.001 |
| 26 | −0.006 | 0.006 |
| 27 | −0.006 | 0.012 |
| 28 | 0.003 | 0 |
| 29 | 0.012 | −0.006 |
| 30 | 0.016 | −0.005 |
| 31 | 0.011 | −0.01 |
| 32 | 0.002 | −0.001 |
| 33 | −0.005 | 0.004 |
| 34 | 0.011 | −0.003 |
| 35 | 0.016 | −0.011 |
| 36 | 0.019 | −0.006 |

From the data in the image placement error table distortion vectors 50 are generated. Distortion vectors 50 are vectorized representations of the differences in spatial location of the overlay features associated with measured information 44 with respect to corresponding overlay features associated with reference information 46. As a result, distortions vectors 50 comprise data 52, mapped into memory 42, concerning a set of spatial locations 54 of features of the pattern on patterned device 20. An exemplary distortion vector 50 generated from image placement variation data would be mapped into memory as a series starting with feature 1 and ending with feature 36 as identifying the x and y variations of each of the features as follows: {0.01, −0.012, 0, −0.003, . . . 0.019, and −0.006}.

Spatial locations 54 represent the spatial location of the overlay features on patterned device 20. Data 52 includes directional and magnitude characteristics of the differences between measured information 44 and reference information 46. Specifically, data 52 includes information concerning the distance, along two orthogonal axes, between spatial locations 54 of each of the overlay features on patterned device 20 with respect to spatial locations of the corresponding overlay feature of the optimal/desired pattern.

Processor 40 operates on routine 48 to process data concerning distortion vectors 50 and generate signals that are sensed by actuators 26 to selectively deform patterned device 20 and attenuate, if not abrogate, differences between measured information 44 and reference information 46, thereby minimize overlay variations between the pattern on patterned device with respect to the optimal/desired pattern. The distance between the overlay features associated with measured information 44 from the corresponding overlay features associated with reference information 46 is minimized by creating translational movement of spatial locations 54. To that end, routine 48 determines the loads to be applied by actuators 26 in order to selectively deform patterned device 20 solving an inverse transform function as follows:

$$[A]\{f\} = \{u\} \quad (1)$$

where [A] represents the compliance matrix to be specified for patterned device 20, $\{f\}$ is a one dimension matrix of elements $f_i$, referred to as a force vector, with i varies from 1 to m, m being the number of force pairs. Elements $f_i$ of force vector $\{f\}$ are weighting coefficients from which the desired loads are determined. $\{u\}$ represents spatial translation of features associated with measured information 44 must undergo in order to match the spatial location of the corresponding feature in reference information 46, i.e., $\{u\}$ represents an additive inverse of the distortion vectors 50. Once compliance matrix [A] is determined, force vector $\{f\}$ is determined from equation (1). Signals are generated by processor 40 to cause actuators 26 to apply the requisite loads to patterned device 20 that are a function of the force vector $\{f\}$. In this fashion, distortions in the patterned device 20 are minimized, if not abrogated.

Compliance matrix [A] is a function of the materials from which patterned device 20 is fabricated. Specifically, the compliance matrix [A] is defined, in part, by the Young's modulus and Poisson's ratio associated with the material from which patterned device 20 is formed. In this example, patterned device 20 is formed from fused silica, but may also be formed from quartz, sapphire, silicon, metals and the like. One manner in which to determine the compliance matrix [A] employs finite element analysis (FEA). To that end, an FEA model of patterned device 20, referred to as modeled device 56 is generated and stored in memory 42, using any known modeling technique, such as software sold under the trade name Pro/Engineer™ 2001 and finite element solver software sold under the trade name Pro/Mechanica™ 2001.

Employing FEA, obtained are measurements of the spatial displacement of each of a plurality of data points 58 of the modeled device 56 in response to simulated loading by actuators 26. Data points 58 represent the spatial location of the overlay features of the pattern on modeled device 56. To obtain useful information, the overlay features with which data points 58 are associated correspond to same features of patterned device 20 that are associated with spatial locations 54. In the present example, each of data points 58 is associated with one of spatial locations 54, such that each of data points 58 corresponds to one of spatial locations 54 that differs from the spatial locations 54 associated with the remaining data points 58.

When determining compliance matrix [A] it is assumed that forces are applied by a pair of actuators so as to be equal and opposite so that force and moment equilibrium hold so that the following conditions are satisfied:

$$\Sigma F_x = 0; \quad (2)$$

$$\Sigma F_y = 0; \text{ and} \quad (3)$$

$$\Sigma M_z = 0, \quad (4)$$

where, Fx are forces in the X direction, Fy are forces in the Y direction and Mz are moments about the Z axis. For each of data points 58 a displacement along the X and Y axes may be defined as follows:

$$X_n = f_1 x_{1n} + f_2 x_{2n} + \ldots + f_m x_{mn} \quad (5)$$

$$Y_n = f_1 y_{1n} + f_2 y_{2n} + \ldots + f_m y_{mn} \quad (6)$$

Where $f_i$ is the magnitude of the force from actuator pair i, n denotes the data point and $x_{in}$, $y_{in}$ represents the movement of a data point n along X, Y directions in terms of millimeters/Newtons in response to a unit force from pairs of actuators i. In the present example, n is an integer from 1 to 4 and i is an integer from 1 to 8. An exemplary compliance matrix [A] based upon the conditions set forth in equations 2-6 for 4 overlay features is as follows:

$$A = 1e-5 * \begin{bmatrix} -0.0350 & -0.3316 & -0.6845 & -0.4965 & 0.4924 & 0.2550 & 0.2025 & -0.5387 \\ 0.4923 & 0.2551 & 0.2028 & -0.5388 & -0.0349 & -0.3316 & -0.6845 & -0.4957 \\ 0.0311 & 0.3313 & 0.6848 & 0.4965 & 0.5387 & -0.2034 & -0.2557 & -0.4926 \\ 0.4930 & 0.2550 & 0.2026 & -0.5389 & -0.4989 & -0.6846 & -0.3310 & -0.0323 \\ -0.4992 & -0.6846 & -0.3310 & -0.0329 & 0.4931 & 0.2549 & 0.2025 & -0.5388 \\ 0.5385 & -0.2033 & -0.2556 & -0.4925 & 0.0313 & 0.3313 & 0.6848 & 0.4973 \\ 0.4938 & 0.6847 & 0.3318 & 0.0333 & 0.5393 & -0.2036 & -0.2560 & -0.4925 \\ 0.5393 & -0.2034 & -0.2559 & 0.4927 & 0.4941 & 0.6846 & 0.3319 & 0.0338 \end{bmatrix}$$

Knowing compliance matrix [A], routine 48 may determine the magnitude of the forces to be generated by actuators 26 to minimize overlay error as the force vector {f}. Specifically, routine 48 solves the force vector {f} from equation (1) as follows:

$$\{f\} = [A]^{-1}\{u\}, \quad (7)$$

were [A] a square matrix. Were [A] not a square matrix. i.e, were the number of rows of compliance matrix [A] (number of rows=2★number of data points) were greater than the number of force pairs (number of columns=number of force pairs), equation (7) is expressed as follows:

$$\{f\} = \{A^T A\}^{-1} A^T \{u\}, \quad (8)$$

where $A^T$ is the transpose matrix of compliance matrix [A].

It may be desired, however, to have routine 48 determine a force vector {f} that satisfies certain predefined constraints, such as the magnitude and direction. For example, it may be desired to avoid tensile forces, because this may require implementing overlay adjustments with an undesired mechanical coupling, e.g., bonding of one of actuators 26 to patterned device 20 in order to applying tensile forces.

In addition, it may be desirable to minimize excessive force that may compromise the structural integrity of patterning device, independent of whether tensile or compressive forces are employed. To that end, it is desired to have routine 48 determine the force vector {f} with the following constraints:

$$f_i \geq 0; \text{ and} \quad (9)$$

$$f_i \leq f_{max} \quad (10)$$

where $f_i$ are elements of the {f} vector, as discussed above. A positive element $f_i$ by convention represents a compressive load on patterned device 20. Routine 48 may calculate the maximum force limit $f_{max}$ from known mechanical properties of the material of patterning device 20. With the constraints shown by (9) and (10), equation (1) can be reformulated as follows:

$$[A]\{f\} - \{u\} = \{e\} \quad (11)$$

Hence the problem becomes finding a force vector {f} such that the error vector {e} is minimized. [A] is the compliance matrix described above. Routine 48 may minimize the error vector {e} over the infinity norm given by the following:

$$\max(|[A]\{f\} - \{u\}|) \quad (12)$$

The reason for selecting to minimize the infinity norm is that it is believed that the magnitude of the absolute value of overlay error that determines a pattern layer's usefulness. As mentioned above, the maximum overlay error is believed to be less than $\frac{1}{3}^{rd}$ the minimum feature size of the pattern, for the pattern layer to be functional. Hence, subject to constraints shown by equations (9) and (10), it is desired to have routine 48 minimize this maximum absolute error, i.e., the infinity norm as follows:

$$\text{Min } (\max|[A]\{f\} - \{u\}|). \quad (13)$$

Objective function (13) is convex piecewise linear in terms of the decision variables, i.e. forces $f_i$. A convex piecewise linear function is, by definition, non-linear. The domain of differences among the set may, therefore, include several local minima. It is desired to have routine 48 identify a global minimum, i.e., the smallest value obtained solving equation 13 subject to the constraints of equations (9) and (10). To that end, routine 48 may be required to undertake several iterations with a range of trial/guess starting vectors and to implement a directional search routine. A typical iterative procedure in accordance with the present invention commences from an initial point where a function value is calculated. The procedure proceeds to solutions in which the function has lower values. This results in routine 48 computing information concerning the function until convergence is identified. Routine 48 ends the procedure at a minimum value where no further reduction in the functional value is identified within the tolerance.

Any known iterative directional search techniques like Newton-Raphson Methods, Conjugate Gradient methods, Quasi-Newton Methods may be employed to get the optimum force vector {f}. One manner in which to implement these techniques is with Microsoft EXCEL, stored in memory 42 and operated on by processor 40 using standard operating systems such as WINDOWS®, available from Microsoft Corporation. The data obtained from the finite element analysis, discussed above, is collated in a matrix form and entered, and the appropriate relationships between the matrices are established, e.g., in accordance with equation (1).

One manner in which to improve the calculation of force vector {f} is by converting the non-linear formulation (13) into a linear problem. To that end, equation (11) is substituted into equation (13). This allows routine 48 to express equation (13) for the series of data 52, as follows:

$$\text{Minimize } (\text{Maximum } (|e_1|, |e_2|, \ldots |e_n|)) \quad (14)$$

where, $e_i$ are the elements of error vector {e}. By routine 48 expanding equation (14), obtained is the following:

$$\text{Minimize } (\text{Maximum } e_1, -e_1, e_2, -e_2, \ldots e_n, -e_n) \quad (15)$$

By routine 48 substituting a variable w for (Maximum $e_1, -e_1, e_2, -e_2, \ldots e_n, -e_n$), equation (15) may be defined as follows:

$$\text{Minimize } (w) \quad (16)$$

Providing the following constraints:

$$w \geq e_i \quad (17)$$

$$w \geq -e_i. \quad (18)$$

That is, routine 48 may solve non-linear equation (13) formulated as equation (16) with the following constraints:

$$w \geq [A]\{f\} - \{u\}; \text{ and} \quad (19)$$

$$w \geq \{u\} - [A]\{f\} \quad (20)$$

in addition to the constraints of equations (1), (9) and (10). An advantage with reformulating equation (13) as a linear problem is that the linear problem is likely to converge to the global minimum in a finite number of steps, under pseudo-polynomial algorithms like the Simplex method. This minimizes the computational power required to have routine 48 determine the global minimum. Iterative search techniques can however still be used. Also, most often non-linear programming techniques converge to the local optima, unless careful checks are implemented. This was noticed to happen when EXCEL tried to solve the non-linear problem. As a result, reformulated equation (13) as a linear problem facilitates obtaining the minimum among the set of data 52 while minimizing the computational power required.

The embodiments of the present invention described above are exemplary. Many changes and modifications may be made to the disclosure recited above, while remaining within the scope of the invention. For example, the method described above is discussed with respect to attenuating, if not eliminating overlay error resulting from both image placement and other characteristics, such as magnification, orthogonality and trapezoidal errors in the case of imprint lithography. Were magnification, orthogonality and/or trapezoidal not present or corrected by other methods, for example in the case of optical lithography, the invention described above can be used to minimize the uncorrected overlay errors. The scope of the invention should, therefore, not be limited by the above description, but instead should be determined with reference to the appended claims along with their full scope of equivalents.

What is claimed is:

1. A method for determining deformation parameters that a patterned device would undergo to minimize dimensional variations between a recorded pattern thereon and a reference pattern, said method comprising:
   comparing spatial variations between features of said recorded pattern with respect to corresponding features of said reference pattern;
   generating distortion vectors from location differences between said features in said recorded pattern and said corresponding features of said reference pattern; and
   determining directly opposing deformation force pairs from said distortion vectors to apply to said patterned device to attenuate said dimensional variations, with said force pairs having predetermined constraints.

2. The method as recited in claim 1 wherein said constraints include omission of tensile forces among said deformation force pairs.

3. The method as recited in claim 1 wherein said constraints include omission of high magnitude forces that would compromise a structural integrity of said patterned device.

4. The method as recited in claim 1 wherein determining further includes ascertaining a constrained force vector and with said deformation force pairs being determined as a function of said constrained force vector.

5. The method as recited in claim 1 wherein determining further includes minimizing a magnitude of a maximum absolute value of an overlay error.

6. The method as recited in claim 1 wherein determining further includes ascertaining pairs of said deformational forces to apply to said patterned device further including applying said pairs of deformational forces to said patterned device with each force of said pair having the same magnitude and a direction, with the direction of one of said pair of forces being opposite to the direction associated with the remaining force of said pair of forces.

7. The method as recited in claim 1 wherein comparing further includes comparing overlay features on said patterned device with respect to corresponding overlay features associated with computer data employed to write said pattern on said patterned device.

8. The method as recited in claim 1 wherein determining further includes minimizing the magnitude of the maximum absolute value of overlay error and identifying a global minimum.

9. A method for determining deformation parameters that a patterned device would undergo to minimize dimensional variations between a recorded pattern thereon and a reference pattern, said method comprising:
   comparing spatial variations between features of said recorded pattern with respect to corresponding features of said reference pattern wherein determining further includes ascertaining compressive deformational forces to apply to said patterned device to attenuate said dimensional variations.

10. A method for determining deformation parameters that a patterned device would undergo to minimize dimensional variations between a recorded pattern thereon and a reference pattern, said method comprising:
    comparing spatial variations between features of said recorded pattern with respect to corresponding features of said reference pattern;
    generating distortion vectors from location differences between said features of said recorded pattern and said corresponding features of said reference pattern; and
    determining directly opposing deformation force pairs from said distortion vectors to apply to said patterned device to attenuate said dimensional variations, with all of said deformation force pairs being compression forces to apply to said patterned device.

11. The method as recited in claim 10 wherein determining further includes determining said deformation force pairs such that all of said deformation force pairs have a magnitude associated therewith that is below a predetermined threshold.

12. The method as recited in claim 10 wherein determining further includes minimizing the magnitude of the maximum absolute value of overlay error.

13. The method as recited in claim 10 wherein determining further includes ascertaining pairs of said deformational forces to apply to said patterned device further including applying said pairs of deformational forces to said patterned device with each force of said pair having the same magnitude and a direction, with the direction of one of said pair of forces being opposite to the direction associated with the remaining force of said pair of forces.

14. The method as recited in claim 10 wherein comparing further includes comparing overlay features on said patterned device with respect to corresponding overlay features associated with computer data employed to write said pattern on said patterned device.

15. The method as recited in claim 10 wherein determining further includes minimizing the magnitude of the maximum absolute value of overlay error and identifying a global minimum.

16. A system for determining deformation parameters that a patterned device would undergo to minimize dimensional variations between a recorded pattern thereon and a reference pattern, said method comprising:
    means for comparing spatial variations between features of said recorded pattern with respect to corresponding features of said reference pattern;
    means for generating distortion vectors from location differences between said features of said recorded pattern and said corresponding features of said reference pattern; and
    means for determining directly opposing deformation force pairs from said distortion vectors to apply to said patterned device to attenuate said dimensional variations, with said force pairs having predetermined constraints.

17. The system as recited in claim 16 wherein means for determining further includes means for determining said deformation force pairs such that all of said deformation force pairs have a magnitude associated therewith that is below a predetermined threshold.

18. The system as recited in claim 16 wherein means for determining further includes means for minimizing the magnitude of the maximum absolute value of overlay error.

19. The system as recited in claim 16 wherein determining further includes means for ascertaining pairs of said deformational forces to apply to said patterned device further including means for applying said pairs of deformational forces to said patterned device with each force of said pair having the same magnitude and a direction, with the direction of one of said pair of forces being opposite to the direction associated with the remaining force of said pair of forces.

20. A method for determining deformation parameters that, when applied to a patterned device, minimize dimensional variations between a recorded pattern thereon and a reference pattern, the method comprising:

generating differences in measured locations of feature points on the recorded pattern and corresponding feature points on the reference pattern;

generating distortion vectors from the differences in the measured locations of the feature points on the recorded pattern and the corresponding feature points on the reference pattern;

generating a compliance matrix from a spatial and material characteristic model of the patterned device by applying simulated force pairs to a model of the patterned device and determining a relationship between registered movements of the feature points on the recorded pattern on the model of the patterned device and the applied simulated force pairs, wherein the applied simulated force pairs meet predetermined magnitude and directional constraints; and generating, from the compliance matrix and the measured location of the feature points on the recorded pattern, directly opposing force pairs that minimize dimensional variations between the recorded pattern thereon and the reference pattern when applied to the patterned device, wherein the force pairs meet the predetermined magnitude and directional constraints.

21. The method of claim 20, further comprising generating signals to apply to actuators configured to engage the patterned device to thereby generate the force pairs.

22. The method of claim 20, wherein the magnitude and directional constraints include a zero resultant summation of forces in orthogonal planar axes of the patterned device and a zero resultant summation of moments about an axis orthogonal to both the planar axes.

23. The method of claim 20, wherein the material characteristic model includes a Young's modulus and Poisson's ratio of a material from which the patterned device is made.

24. The method of claim 20, wherein the spatial characteristics include a finite element model of the patterned device.

25. The method of claim 20, wherein the relationship between registered movements of the feature points on the recorded pattern on the model of the patterned device and the applied simulated force pairs is a linear relationship.

26. The method of claim 20, further comprising applying the force pairs to the patterned device.

27. The method of claim 26, wherein the four pairs are applied to the patterned device through actuators engaged with the pattern device.

* * * * *